United States Patent [19]

Neuenfeldt et al.

[11] Patent Number: 5,035,281
[45] Date of Patent: Jul. 30, 1991

[54] HEAT EXCHANGER FOR COOLING AND METHOD OF SERVICING SAME

[75] Inventors: Douglas L. Neuenfeldt, Coon Rapids; Roger A. Peterson, Lake Township, Kanabec County, both of Minn.

[73] Assignee: McLean Midwest Corporation, Brooklyn Partk, Minn.

[21] Appl. No.: 405,285

[22] Filed: Sep. 7, 1989

[51] Int. Cl.⁵ ............... H01L 23/467; F28D 15/02
[52] U.S. Cl. ........................ 165/76; 165/77; 165/78; 165/95; 165/104.14; 165/104.34; 165/86; 165/104.33
[58] Field of Search ............ 165/104.14, 76, 77, 165/54, 86, 104.33, 104.34, 95; 62/449; 361/384, 385

[56] References Cited

U.S. PATENT DOCUMENTS

| | | | |
|---|---|---|---|
| 3,807,493 | 4/1974 | Stewart | 165/104.33 |
| 4,386,651 | 6/1983 | Reinhard | 165/104.34 |
| 4,475,687 | 10/1984 | Schulz | 165/77 |
| 4,512,392 | 4/1985 | Ee et al. | 165/54 |
| 4,512,393 | 4/1985 | Maendel | 165/54 |
| 4,706,739 | 11/1987 | Noren | 165/104.33 |
| 4,832,116 | 5/1989 | Easton | 165/95 |

FOREIGN PATENT DOCUMENTS

| | | | |
|---|---|---|---|
| 157481 | 9/1984 | Japan | 165/104.33 |
| 229184 | 12/1984 | Japan | 165/104.34 |

Primary Examiner—Albert W. Davis, Jr.
Attorney, Agent, or Firm—Henry C. Kovar

[57] ABSTRACT

A heat exchanger for cooling enclosures, typically electronic enclosures, has a box with a heat pipe type exchange element and upper and lower fan units. A novel element holder and box structure and arrangement of components provides for safety, NEMA-12 sealing, easy access and cleaning without tools, and enables the exchanger to be inverted end-for-end and mounted either on the inside or outside of the exchanger while providing a cover that easily comes off for service. The exchanger has an ambient fan and motor and a heat load fan and motor normally inside the box, and both fan and motors and the exchanger are movable to alternative positions for service. A method of servicing a heat exchanger is provided wherein two fans and motors, and a heat exchanger sequentially are unlocked and moved to alternative service positions.

25 Claims, 4 Drawing Sheets

HEAT EXCHANGER FOR COOLING AND METHOD OF SERVICING SAME

BACKGROUND OF THE INVENTION

1. Field of the Invention:

This invention pertains to a heat exchanger for extracting heat from enclosures such as those that house electronic controls for manufacturing machinery and lines, with the heat exchanger having improved cabinetry and component mounting which provides increased versatility and easier servicing, and to a method of servicing a heat exchanger.

2. The Prior Art:

Heat exchangers of this general type have a condenser coil, usually of the heat pipe type, and a pair of fans for moving air through the coil. The heat exchanger is utilized for cooling an electronics or electrical controls enclosure space such as those commonly seen on major machine tools; robots, activated assembly lines, process controls and the like. One of the fans draws air in a closed loop from the enclosure into the exchanger and through the coil to extract heat load from the enclosure. The second fan takes in ambient air and moves it through the coil and expels it to ambient. Heat is taken by the coil from enclosure air and transferred to ambient air and then expelled. The virtues of this type of heat exchanger for extending service life and increasing reliability of electronics is well known and accepted.

Several problems have not yet been solved. These heat exchangers are attitude sensitive and require peculiar and specific mounting arrangement and attitudes. They are very sensitive to accumulation of dust, grime, and the like that reduces air flow and/or direct and indirect heat transfer. The motors and fan blade have not been accessible for servicing. The exchangers have not provided for mounting and being positional either inside or outside of the enclosure. These exchangers have had problems with short circuiting of air flow, particularly in the enclosure. The heat exchanger coil elements have been exceeding difficult to access and clean and service. These exchangers have had to be manufactured in several discretely different and dedicated structures, even for the same given heat exchange capacity.

Heat exchangers of this type are very sensitive to dirt and need regular cleaning. Existing exchangers have failed to provide a structure or method for easy cleaning of all fans, motors and coils.

OBJECTS OF THE INVENTION

It is an object of this invention to provide a new and improved heat exchanger for exchanger of heat from electronic enclosures and/or other heat loads, and improved methods of using these heat exchangers.

It is an object of this invention to provide an improved heat exchanger having a quick release heat exchanger element and a method therefor.

It is an object of this invention to provide an improved heat exchanger having a cover with structure for holding a removable heat exchange element in place, and a method therefor.

It is an object of this invention to provide an improved heat exchanger and method of servicing with a heat exchange element and a pair of motor/fan units, all of which easily move between normal operating positions and alternative service positions without tools.

It is an object of this invention to provide an improved heat exchanger having motors and fans which are movable back and forth between normal operation and exposed cleaning and service positions and a method therefor.

It is an object of this invention to provide an improved heat exchanger which is invertible end-for-end enabling mounting either inside or outside of an enclosure and a method therefor.

It is an object of this invention to provide a heat exchanger having sequential unlocking of components, without tools, and a method therefor.

SUMMARY OF INVENTION

A heat exchanger has a box with a cover, a heat exchanger element in the box, a first electric motor and air mover for heat load air, a second electric motor and air mover for ambient air, structure for moving the first and second air motors back and forth between normal use and alternative service access positions, and structure for fixing the motors in normal operating position when the cover is closed.

A heat exchanger has a box with front and back sides, opposed ends, a central heat exchanger element in the box, opposed air openings in each end and structure on the box for mounting the exchanger on the outside of an enclosure with a first end up, and for mounting the exchanger on the inside of an enclosure with a second end up.

A heat exchanger for cooling has a box with an openable cover, a heat exchanger element in the box, first and second air moving structure in the box, and structure for moving the element and both air moving structures to alternative service positions providing direct access thereto.

A heat exchanger for cooling has a box with a cover, a heat exchanger element, first and second air moving structure, an ambient outlet and load inlet on one end of the box, an ambient inlet and load outlet on a second end of the box, upper and lower baffles separating the inlets and outlets and structure for removing the element from the box for service.

A heat exchanger has a box with a cover, a heat exchange element, first and second air moving structures, a quick release element mount in the box, and structure for sequentially moving the moving structures and element between normal operating positions and alternative service positions.

A method of servicing a heat exchanger has a series of sequential steps that unlock a pair of air moving structures and a heat exchange element, enabling movement of these components between locked normal operating positions and alternative accessible service positions.

Several improved methods of using a heat exchanger having a box, a heat exchanger element and pair of air moving elements have new and novel steps of usage for increased utility and/or ease of service.

Many other advantages, features, and additional objects of the present invention will become manifest to those versed in the art upon making reference to the detailed descriptin and accompanying drawings in which the preferred embodiment incorporating the principles of the present invention is set forth and shown by way of illustrative example.

BRIEF DESCRIPTION OF THE DRAWINGS

FIG. 1 is a side elevational view in section of the preferred embodiment of the heat exchanger of the present invention, with the cover on;

DESCRIPTION OF THE PREFERRED EMBODIMENT

Figure 1:
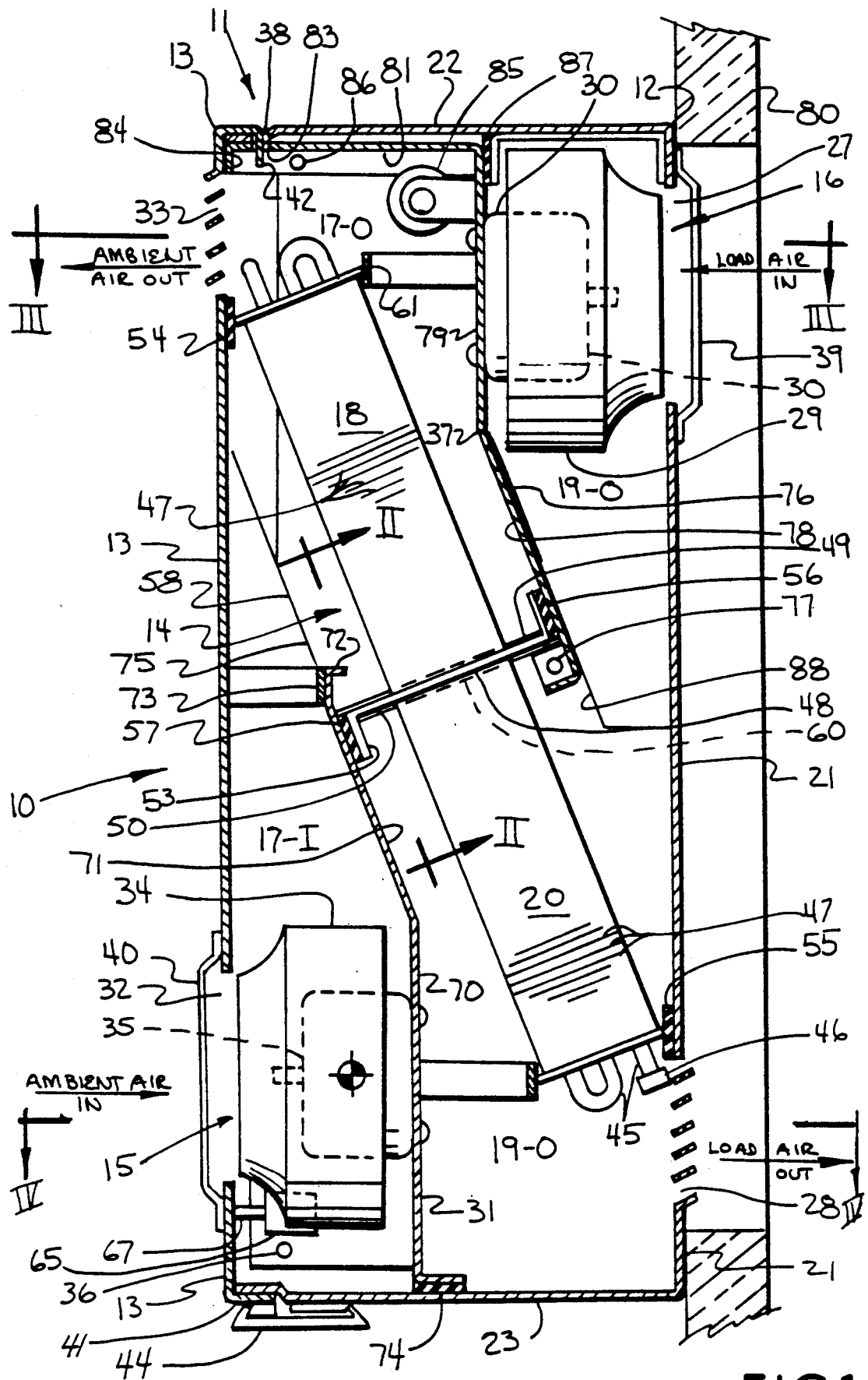

According to the principles of this invention, a new and improved heat exchanger for cooling a heat load is shown in FIG. 1 and generally indicated by the numeral 10, and will hereafter simply be referred to as the "exchanger 10". The exchanger 10 has a box 11 having a frame 12 and an openable and removable cover 13. Inside the box 11 is a centrally located and operatively positioned heat exchange element generally indicated by the numeral 14 and which will hereafter simply be referred to as the "element 14". Also inside the box 11 is an ambient air moving unit 15, a heat load air moving unit 16, an ambient air chamber 17 which is always in fluid communication with an upper or ambiant end 18 of the exchanger 10 and a heat load air chamber 19 which is always in fluid communication with a lower or heat load end 20 of the exchanger 10. Box air moving units 15, 16 are mounted in and to the box 12, either directly or indirectly.

The box 12 has a back panel 21, a top 22, a bottom 23, a left side 24, and a right side 25 preferably bounded on the front edge by an inturned and offset front flange 26.

The heat load air moving unit 16 is mounted inside of the back panel 21 in the heat load chamber 19, and when operating draws hot air in a load inlet 27 and through the lower heat extraction end 20 of the exchanger 14 and then exhausts the cooled heat load air out of air outlet 28 in the back panel 21. The heat load air moving unit 16 has a fan or impeller 29 driven by an electric motor 30 which preferably faces toward the cover 13.

The ambient air moving unit 15 is preferably mounted on and to a subframe 31 which in turn is movably mounted to the frame 12. The ambient air unit 15 is inside the frame 12 and in the ambient chamber 17 and when operating draws ambient air in an ambiant inlet 32 and through the top heat expelling end 18 of the exchanger 14 and then exhausts warmed ambient air out of an ambiant outlet 33. The ambient air unit 15 has a fan or impeller 34 facing the cover 13 and an electric motor 35 facing the back panel 21. The ambient unit subframe 31 preferably is movable mounted to the frame 12 on a transverse hinge 36 which preferably is adjacent the bottom of the subframe 31.

A protective grill 39 for the load air fan 29 is mounted to the back panel 21 and a protective grill 40 for the ambient air fan 34 is mounted to the cover 13. The cover 13 is preferably structurally discrete and completely removable from the frame 12 when the cover 13 is opened. The cover 13 has an outer perimeter flange 41 that encloses the frame flange 26 and a pair of inward extending lock tongues 42 that project inwardly through lock apertures 43 in the frame flange 26 and also through upper subframe lock abutments 38 to fix an upper subframe 37 in position with respect to the frame 12. The opposite end of cover 13 is secured to and against the frame 12 by one or more manual latches 44 on the bottom end panel 23. The heat exchanger element 14 is preferably a heat pipe type exchanger element 14 with a closed pipe 45 that is charged with an appropriate refrigerant, through a conventional charging valve and cap 46. The exchanger element 14 has a plurality of secondary area heat exchanger fins 47 and has a central divider or barrier 48 which divides the exchanger into the upper heat expelling and lower heat extraction ends or zones 18, 20. The divider 48 extends outward beyond all four sides of the fins 47 of the exchager element 14. The divider 48 has a back plate 49 extending to the upper subframe 37 and a front plate 50 extending to the lower subframe 31. A transverse tongue 51, 52 is part of the divider 48, and each tongue 51, 52 extends transversely out beyond a respective side of the exchanger element fins 47. A manually graspable handle 53 is provided on the front plate 50. The exchanger element 14 preferably is fixed in a tilted or canted position as best seen in FIG. 1, wherein the top front edge of the exchanger 14 seals against a top gasket 54 on the cover 13 and a bottom back edge of the exchanger 14 seals against a back gasket 55 on the back panel 21. The divider 48 likewise seals against a back upper gasket 56 and a front lower gasket 57.

Figure 2:
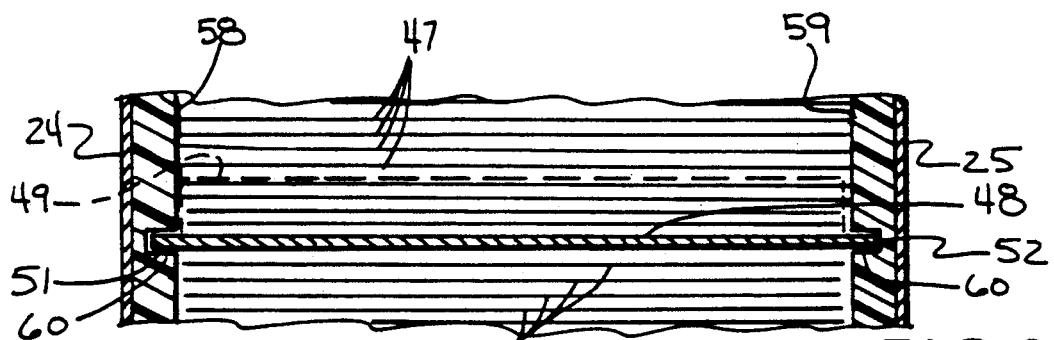
FIG. 2 is a front elevational view in section, through lines II—II of FIG. 1.
Figure 3:
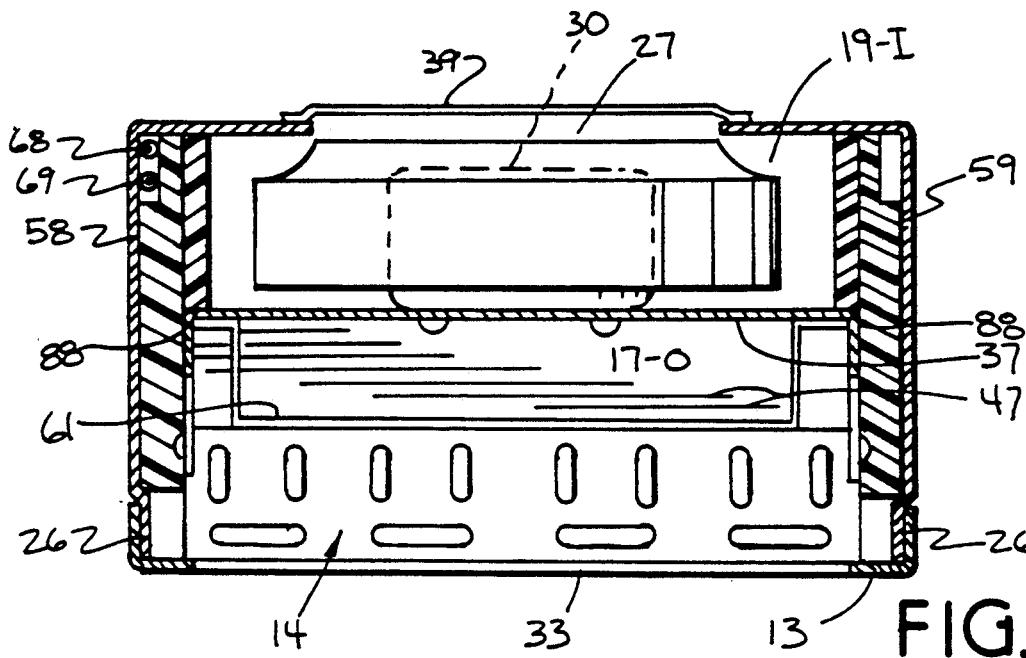
FIG. 3 is a top plan view in section through lines III—III of FIG. 1.
Figure 4:
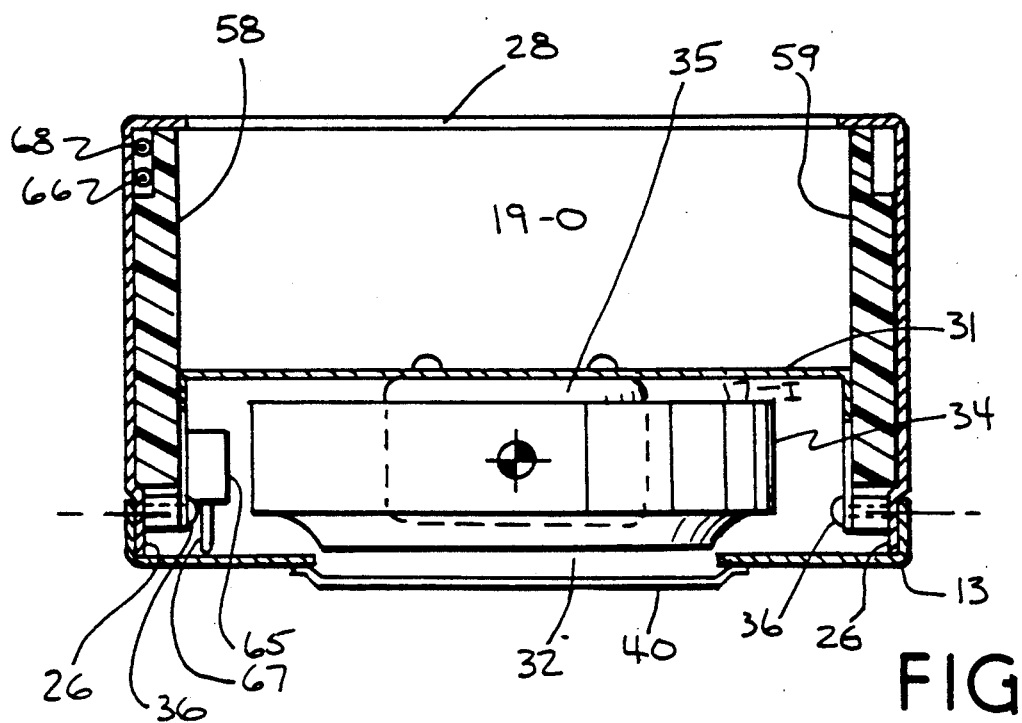
FIG. 4 is a top plan view in section through lines IV—IV of FIG. 1.

A very new and novel aspect of this invention is the method of and structure for mounting and holding the heat exchanger element 14 in the box 11. On each transverse side of the exchanger element 14 is an exchanger side plate 58, 59. The exchanger element 14 is a very snug fit within the exchanger side plates 58, 59 and each plate 58, 59 has an upwardly slanted slot 60, best seen in FIGS. 2 & 5, to receive the divider tongues 51, 52 respectively in a tongue and groove type construction. This interfitting engagement between the tongues 51, 52 and slots 60 precisely locates the exchanger element 14 in its height and angle, and also supports the weight of the exchanger element 14. The transverse sides of the exchanger element 14 also seal against the exchanger side plates 58, 59 which have a height that is at least the equal of the height of the exchanger element 14. At the top of the exchanger element 14 is a stand-off type stop 61 against which the back top cover of the exchanger 14 abuts. The least costly side plates 58, 59 are of sheet metal, the preferrable side plates 58, 59 are of a low friction thermo plastic such as polyethelyene or polypropylene.

Figure 6:
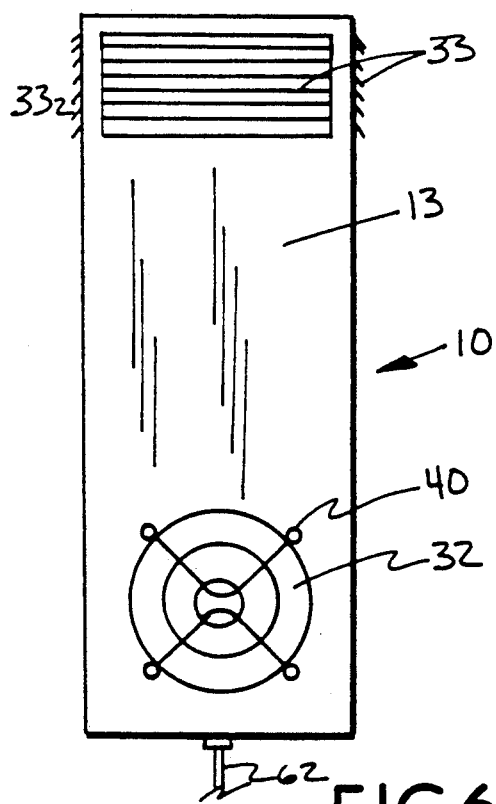
FIG. 6 is a front elevational view of the structure of FIG. 1.

Power for the air moving units 15, 16 is provided in a service cord 62 which may enter the box 11 by a back cord entry 63 or an alternative cord entry 64. The cord 62 has a common lead 68 connected in parallel to both motors 30, 34 and a hot lead connected to common of a safety interlock and switch 65. A hot lead 66 connects the manually open terminal of the switch 65 in parallel to both the motors 30, 34. The switch 65 has an activator 67 which extends forward beyond the box flange 26 to engage the inside of the cover 13. The leads 66, 68 are both extended upward the length of the box 11 to reach the top motor 30 and are recessed behind the left exchanger side plate 58 as shown in FIG. 6. The switch 65 is located in the end of the box 11 which is opposite to the cover lock tongues 42.

FIG. 6 best shows the front side of the exchanger 10 with the ambiant air inlet 32 and the ambiant air outlet 33.

Figure 7:
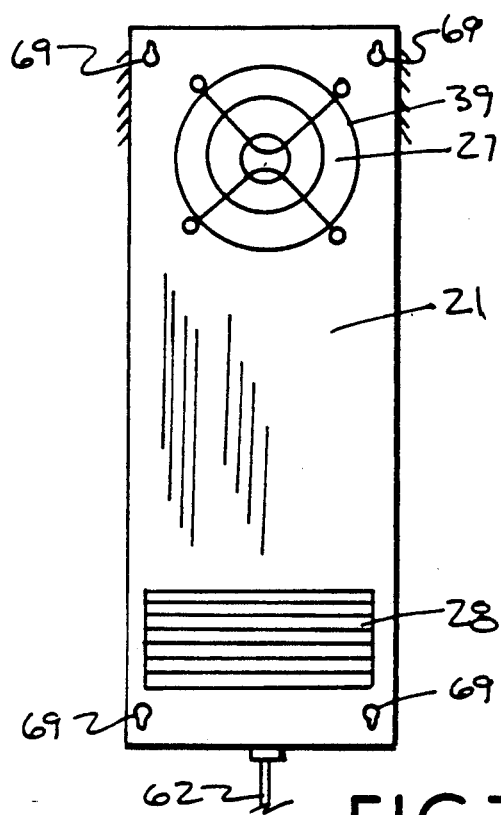
FIG. 7 is a rear elevational view of the structure of FIG. 1.

FIG. 7 best shows the back side of the exchanger 10 with the load air inlet 27 and load air outlet 28. In each corner of the back panel 21 is an outward facing keyhole 69. Each end of the enlarged box 11 has one and preferably one pair of these keyholes 69 for hanging of the exchanger 10 on other structure. The keyholes 69 have a pattern which is identical on both ends of the exchanger 10. FIGS. 6 and 7 best show that the geometric patterns and positions of the air inlets 27, 32 and air outlets 28, 33 are essentially identical on each end of the box 11 and are symmetrical about a transverse centerline of the box 11.

Figure 8:
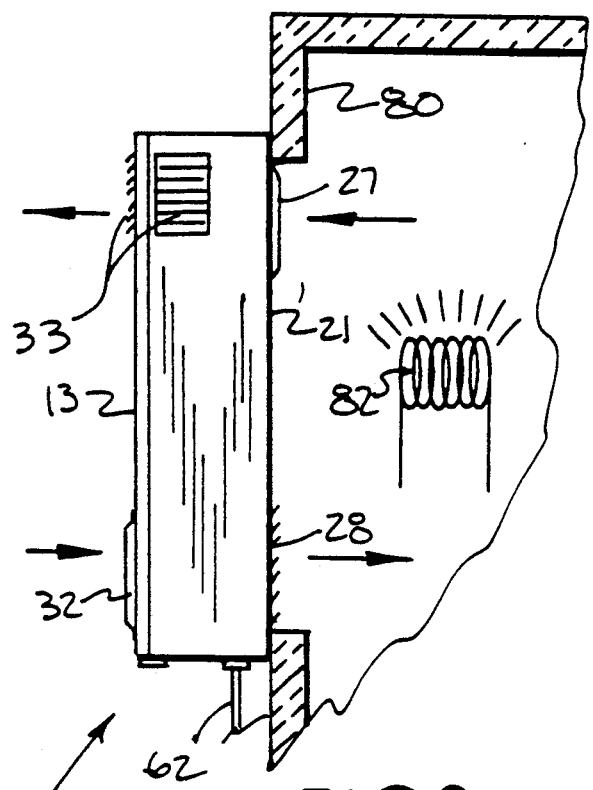
FIG. 8 is a side elevational view of the structure of FIG. 1.
Figure 9:
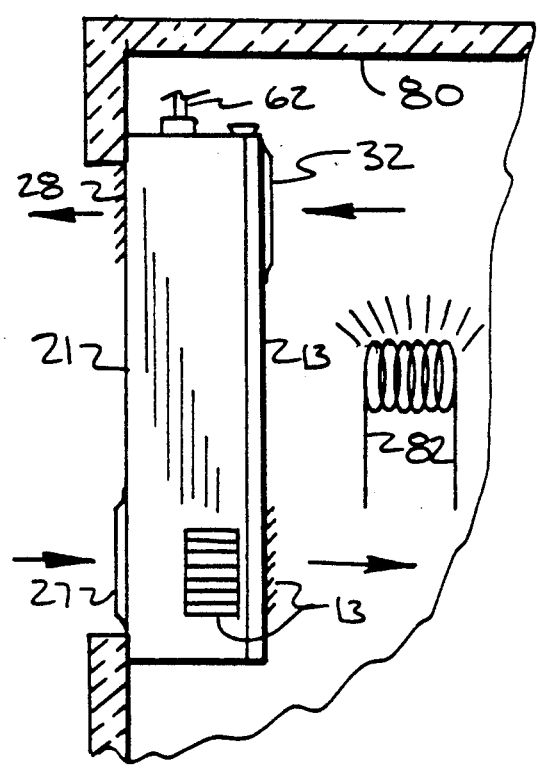
FIG. 9 is a side elevational view of the structure of FIG. 1 inverted end-for-end.

FIGS. 8 and 9 best shows how the exchanger 10 is used and can be mounted in either of two configurations. Firstly in FIG. 8 the exchanger 10 is mounted on the outside of an air enclosure 80 which has therein a heat source 82, which is usually electronic apparatus, and which heats up the air inside of the enclosure 80. Hot enclosure air which is the load air, is taken in through load inlet 27, cooled and returned out of the load outlet 28. On the ambient or corner 33 side, ambient air is taken in ambient inlet 32, heated, and expelled out of the ambient outlet 33. The cover 13 faces outward and is easily removed for access to inside of the exchanger 10. In FIG. 9, the exchanger 10 is shown mounted on the inside of the enclosure 80. Remember that in devices such as the exchanger 10, which utilizes a heat pipe type element 14, the heat is absorbed or extracted at the bottom of the element 14 and expelled at the top of the element 14, always. The entire exchanger 10 may be inverted end-for-end and now heat load air is taken in inlet 32 and expelled out outlet 33. Ambient air is taken in inlet 27 and expelled out outlet 28. The cord 62 may need to be alternatively routed on the inside mount. With the tilted exchanger element 14, the exchanger 10 can also be mounted on the inside or outside of the top or bottom of the enclosure 80. Regardless of how the exchanger 10 is used, the back panel 21 is secured against the wall of the enclosure 80 and the cover 13 is easily removable while the frame 12 remains secured to the enclosure 80 and the power remains connected.

Important features of this invention include the structure for movably mounting the air moving units 15, 16 and the exchanger element 14. The lower or ambient air moving unit 15 and the lock-out switch 65 are both mounted upon a movable lower subframe baffle 31 which has an upright section 70, a canted section 71 which is generally parallel to the exchanger element 14, and a stiffener flange 72 which also functionally provides a handle. The top of the baffle 31 is pushed inwardly and held in position by a stand-off type stop 73 on the cover 13. The lower baffle 31 has a bottom seal or gasket 74 and the baffle 31 is held against front surfaces 75 of the side plates 58, 59 to complete an effective airtight seal. An upper subframe baffle 76 has a transverse hinge 77 which is located immediately adjacent and preferably below the element divider 48, a canted lower panel 78 which is preferably generally parallel to the exchanger element 14, an upright panel 79 to which the load air moving unit 16 is mounted and a generally horizontal top panel 81, having lock apertures 83 and a handle flange 84. A capacitor 85 for both motors 30, 35, may be mounted on the upper baffles 76. The top stop 61 for the element 14 is on the upper baffle 76. A pair of snap detent type fasteners 86 are preferably provided at the top of the upper baffle 76 and the side plates 58, 59. The upper baffle is a slip fit in between the side plates 58, 59 and when in operative position is sealingly abutted against a top gasket 87, the divider back gasket 56, and forward facing central edges 88 of the side plates 58, 59.

Note that in the ambient air moving unit 15, the center of gravity of the motor/fan unit 15 is inboard of the transverse hinge 36 so that the unit 15 is stable in its normal position inside of the box 11.

Figure 5:
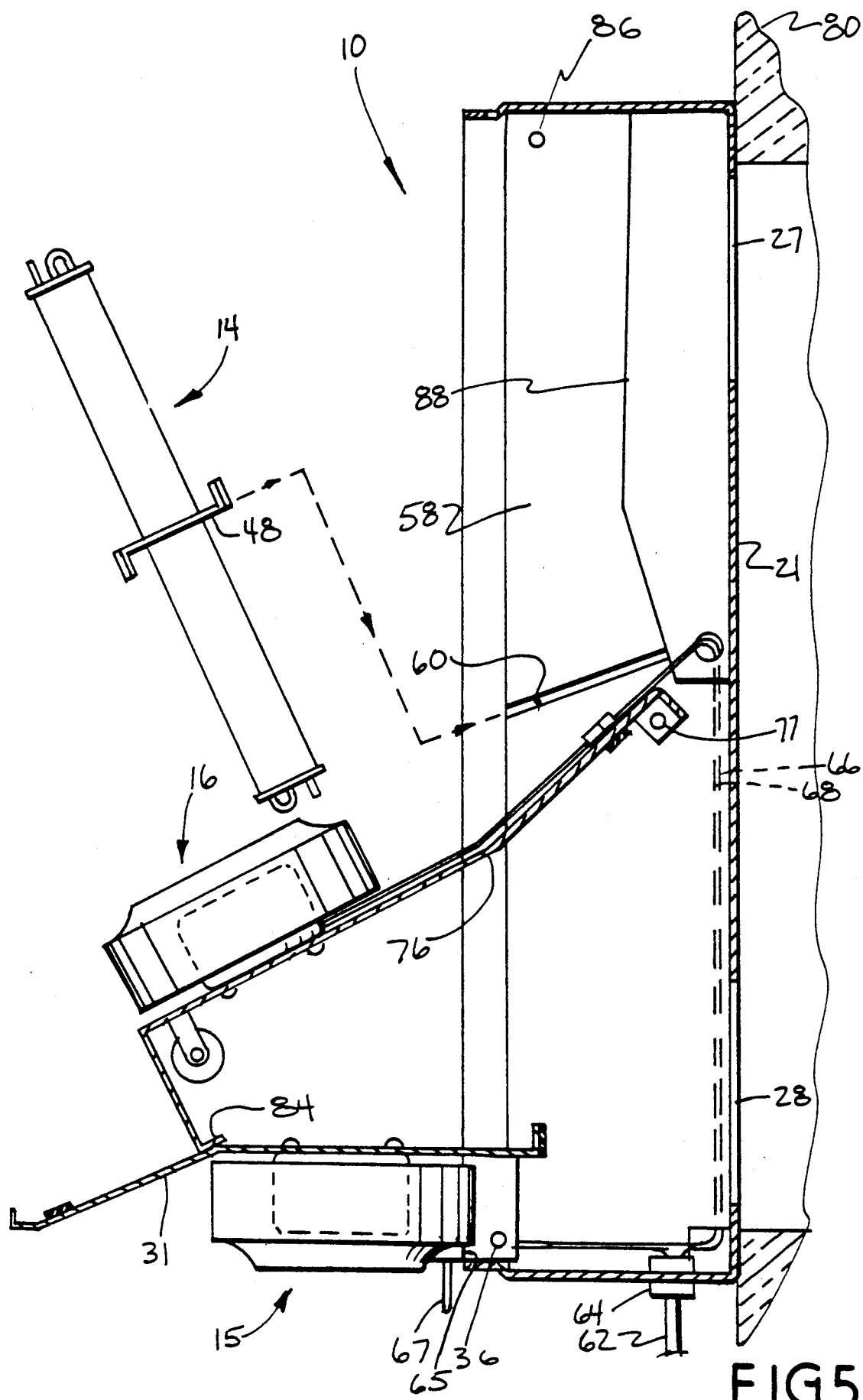
FIG. 5 is a side elevational view in section of the structure of FIG. 1 with the cover off, the element removed, and the fans and motors in an alternative service position.

In operation and use of the heat exchanger 10 and in the practice of the method of the present invention, the normal operative positions of all components are shown in FIG. 1 and the alternative service positions are shown in FIG. 5. To go from one to the other, we can start at FIG. 1 with the heat exchanger 10 mounted in place on the enclosure 80 and having been successfully used for cooling the heat load 82 over a period of time. The latches 44 are popped open, the bottom of the cover 13 is swung out whereupon the lock out switch 65 breaks electrical power to the motors 30, 35 and they cease to operate. The cover 13 is then lifted to extract the lock tongues 42 from the apertures 38, 83 in the box 11 and the upper baffle 76. The lower fan and motor unit 15 are then openly accessable and are cleaned. The handle flange 72 is then pulled out and the lower unit 15 swings outward to the service position shown in FIG. 5 whereupon the element 14 is unlocked and slid out of slots 60 and out of the box 11 providing access to all sides of the element 14 for cleaning and/or refrigerant changing. When the element 14 is removed, the upper baffle 76 is unlocked and the upper handle 84 is grasped to turn out the upper baffle 76 and upper motor/fan unit 16 to the service position shown in FIG. 5 whereupon this unit 16 is cleaned and serviced. In the event of motor 30, 35, failure, either may be easily changed. Both motor/fan units 15, 16 are directly accessible for vacuum cleaning and/or compressed air blow-off, without removal of the box 11 from the enclosure 80 and without breaking the electrical lines. The element 14 is also easily removed for total and complete discrete access. To bring the unit 10 back into operation, the upper baffle 76 is turned up and pushed in the box 11 whereupon the detents 86 hold it in place. The element 14 is then pushed in to lock the upper baffle 76 in place, the lower baffle 31 is turned up and back into the box 11 to hold the element 14 in, and the cover 13 has the lock tongues 42 inserted through the registering apertures 38, 83 to positively lock the upper baffle 76 and upper air moving unit 16 in place. The cover 13 is then swung in and the stand off 73 pushes the handle flange 72 tightly against the divider 48 to lock and seal the divider 48 and element 14 to the baffles 31, 76. When the cover 13 is completely on, lock out switch 65 restores power and the motor/fan units 15, 16 restart. The latches 44 are then rehooked and set and the unit is back in normal operation.

No tools are needed, and service is easy, quick, safe, and done without special training. The exchanger 10 provides effective air tight sealing for its primary purposes and offers vastly increased operative effectiveness by virtue of its being swiftly and easily cleaned to maintain its best performance and highest energy effeciency level.

Referring back to FIG. 5 where the exchanger 10 is shown with the cover 13 opened and removed from the frame 12, the exchanger element 14 is simply manually grasped by the handle 53 and pulled out of the frame 12 for cleaning and/or replacement. To re-install the element 14, the tongues 51, 52 are placed in the slots 60 and the entire element 14 is simply pushed into the frame 12 until the element 14 abuts against the stops 61 and the gaskets 55, 56. The lower motor 30 and fan 29 are directly accessible for vacuum cleaning. The switch 65 shuts both air units 15, 16 off when the cover 13 is opened. The upper motor 35 and fan 34 are easily moved out for direct access for cleaning and service.

The exterior of exchanger 10 does not have sharp corners or fasteners and poses no threat in the work environment. The exchanger 10 is extremely well gasketed and maintains a NEMA-12 specification seal of the enclosure 80. The exchanger 10 does not need but may be used with a filter (not shown). Absolutely no tools are needed to access and/or service the exchanger 10, other than a vacuum or compressed air to clean off dust. The exchanger 10 can be safely serviced without disconnecting any permanent wiring or circuits.

The exchanger 10 can be mounted on any side panel, top panel, or bottom panel of an enclosure 80, and then on either the inside or outside because of the ability of the exchanger 10 to be turned, inverted, or flip-flopped end-for-end.

Although other advantages may be found and realized and various modifications may be suggested by those versed and experienced in the art, be it understood that we embody within the scope of the patent warranted hereon, all such embodiments as reasonably and properly come within the scope of our contribution to the art.

WE CLAIM AS OUR INVENTION:

1. A heat exchanger for cooling, comprising;
   a) a box having a frame and an openable cover;
   b) a heat exchange element operatively positioned within the box;
   c) means for separating the element into heat expelling and heat extraction zones;
   d) first air moving means in an operative position in the box for drawing and expelling a flow of ambient air in a passageway extending over said expelling zone;
   e) second air moving means in an operative position in the box for drawing and expelling a flow of heat load air in a passageway extending through the extraction zone;
   f) means for removing said heat exchange element from said box when said cover is opened, enabling access to both sides of the element for easy cleaning thereof;
   g) first mounting means inside of said box for moving said first air moving means from a normal operative position inside said box to an alternative service position outside of said box for cleaning and service;
   h) second mounting means inside of said box and separate from first means, for moving said second air moving means from a normal operative position inside said box to an alternative service position outside of said box for cleaning and service; and in which
   i) said heat exchange element is physically dispensed in between said first mounting means and said second mounting means, removal of said heat exchange element enabling access to one of said first mounting means or said second mounting means.

2. The heat exchanger of claim 1, in which said first mounting means and said second mounting means are both abutted against said heat exchange element.

3. The heat exchanger of claim 1, in which said heat exchange element is a generally upright heat pipe type element, the height of said element extending vertically to the levels of both said first and second air moving means.

4. The heat exchanger of claim 3, in which said element is canted in between said first and second air moving means to form a generally Z-shaped configuration from the side, said first and second mounting means being sealed to said element.

5. The heat exchanger of claim 1, in which said heat exchange element has an abutment which is abutted against said second air moving means is held in its operative position by the element, said first mounting means has an abutment which is abutted against the element so that the element is held in its operative position by the first mounting means, and in which said cover has an abutment which is abutted against the first mounting means so that said first air moving means is held in its operative position by said cover.

6. The heat exchanger of claim 5 in which said cover has an abutment which is abutted against said element.

7. The heat exchanger of claim 5, in which said first mounting means is abutted against said element at the bottom and at a central level of the element, and in which said second mounting means is abutted against said element at a central level and at the top of the element.

8. A heat exchanger for cooling, comprising:
   a. a box having a frame and an openable cover;
   b. a heat exchange element centrally positioned within the box;
   c. means for separating the element into heat expelling and heat extraction zones;
   d. first air moving means in one end of the box for drawing and expelling a flow of ambient air in a passageway extending over said expelling zone;
   e. second air moving means in a second end of the box for drawing and expelling a flow of heat load air in a passageway extending through the extraction zone;
   f. an ambient air outlet and load air inlet on an upper end of the box adjacent a top of the expelling zone of the heat exchange element;
   g. an ambient air inlet and a load air outlet on a lower end of the box adjacent to a bottom of the extraction zone of the heat exchange element;
   h. an upper baffle separating said ambient outlet and said expelling zone from said load inlet;
   i. a lower baffle separating said ambient inlet from said extraction zone and said load outlet; and
   j. means for removing said element from said box for accessing both sides of said element for cleaning.

9. The exchanger of claim 8, in which said first air moving means is mounted to said upper baffle.

10. The exchanger of claim 2, including a hinge connecting said upper baffle to said box frame, said upper baffle being pivotable between a normal operative position within the box frame and an alternative service position at least partially out of said box frame.

11. The exchanger of claim 10, including lock means operative between said cover and said box frame and said upper baffle for positively locking said upper baffle in the normal operative position.

12. The exchanger of claim 10, including holding means inside of said box frame for holding said upper baffle in the normal operative position.

13. The exchanger of claim 10, in which said first air moving means is mounted to said upper baffle, said first air moving means having a load air fan rearward of said upper baffle.

14. The heat exchanger of claim 10, in which said hinge is adjacent a bottom of the upper baffle, said hinge being approximately at a mid-point of the height of the box frame.

15. The heat exchanger of claim 8, in which said second air means is mounted to said lower baffle.

16. A heat exchanger for cooling, comprising:
   a. a box having a frame and an openable cover;
   b. a heat exchange element operatively positioned within the box;
   c. means for separating the element into heat expelling and heat extraction zones;
   d. first air moving means in an operative position in the box for drawing and expelling a flow of ambient air in a passageway extending over said expelling zone;
   e. second air moving means in an operative position in the box for drawing and expelling a flow of heat load air in a passageway extending through the extraction zone;
   f. quick release element mounting means for accepting and supporting the element within the box;
   g. first service means for moving said first air moving means to an alternative service position;
   h. second service means for moving said second air moving means to an alternative service position;
   i. means on said element for holding said second air moving means in said operative position;
   j. means on said first service means for holding said element operatively positioned; and
   k. means on said cover for holding said first air moving means in said operative position.

17. The heat exchanger of claim 16, in which said first service means and said second service means are pivotally secured to said frame.

18. The heat exchanger of claim 16, in which said element separating means has a tongue on each side of the element, said tongue being a portion of said element mounting means.

19. The heat exchanger of claim 18, in which said element mounting means further includes a pair of slots secured to said frame for receiving said tongues to hold said element in its operative position.

20. The heat exchanger of claim 16, in which said holding means on said first service means abut against a bottom of the element and seal against said separating means, and in which holding means on said element seal against a bottom of said second service means and abut against an upper portion of said second service means.

21. A method of servicing a pair of motor driven fans and a heat exchange element in a heat exchanger for cooling, comprising the steps of:
   a. opening a cover on a heat exchanger box, and thereby unlocking a first motor and fan;
   b. moving the unlocked fan and motor from a normal operative position to an alternative service position, and thereby unlocking the heat exchange element;
   c. moving the unlocked heat exchanger element from a normal operative position to an alternative service position providing access to both sides of the element, and thereby unlocking a second motor and fan;
   d. moving the unlocked second motor and fan from a normal operative position to an alternative service position; and
   e. reversing said sequence of steps (a) through (d) to return said heat exchanger to normal operation after servicing of said element and both said motors and fans.

22. The method of claim 21, including the further step of firstly unlocking the second motor and fan by the step of opening the cover.

23. The method of claim 21, including the further step of pushing the element against the second motor and fan with the cover.

24. The method of claim 21, in which the first fan and motor are pivotally moved to the alternative position, and in which the second fan and motor are independently pivotally moved to their alternative positions.

25. The method of claim 21, in which the element is slid outwardly in a tongue and groove structure for complete removal of the element from said box.

* * * * *